(12) United States Patent
Liao

(10) Patent No.: US 6,225,642 B1
(45) Date of Patent: *May 1, 2001

(54) BURIED CHANNEL VERTICAL DOUBLE DIFFUSION MOS DEVICE

(75) Inventor: Kuan-Yang Liao, Taipei (TW)

(73) Assignee: United Silicon Inc., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/076,363

(22) Filed: May 11, 1998

(30) Foreign Application Priority Data

Apr. 20, 1998 (TW) ............................................. 871055996

(51) Int. Cl.[7] ................................................. H01L 29/792
(52) U.S. Cl. .............................. 257/3; 257/327; 257/328; 257/329; 257/335
(58) Field of Search ................................. 257/327–346, 257/328, 329

(56) References Cited

U.S. PATENT DOCUMENTS 3,673,471 * 6/1972 Klein et al. ............................. 257/407
5,055,895 * 10/1991 Akiyama et al. ...................... 257/403
5,786,619 * 6/1998 Kinzer .................................... 257/403
5,877,527 * 3/1999 Okabe et al. .......................... 257/328

* cited by examiner

Primary Examiner—Fetsum Abraham
(74) Attorney, Agent, or Firm—Christie, Parker & Hale, LLP

(57) ABSTRACT

A buried channel vertical double-diffusion MOS (buried channel VDMOS) device comprising a substrate, a drain region, a gate region, a source region and a channel region. The drain region is located above the substrate and the gate region is above the substrate surface. The source region is located between two neighboring gates in the substrate. The channel region is located above the drain region separated from the gate by a gate-insulating layer. The channel region further includes a main region, a buried channel region, a first region and a second region. The buried channel region is located below the gate-insulating layer. The buried channel region is impurity-doped so that the threshold voltage of the buried channel VDMOS device can be adjusted. The first region is located in the substrate between two neighboring gates, next to the drain region with portion of it extending into the region underneath the gate. The second region is located below the source region and directly under the first region, but the second region does not have direct contact with the source region.

13 Claims, 1 Drawing Sheet

BURIED CHANNEL VERTICAL DOUBLE DIFFUSION MOS DEVICE

CROSS-REFERENCE TO RELATED APPLICATION

This application claims the priority benefit of Taiwan application Ser. No. 87,105,996, filed Apr. 20, 1998, the full disclosure of which is incorporated herein by reference.

BACKGROUND OF THE INVENTION

1. Field of Invention

The present invention relates to a vertical double-diffusion MOS (VDMOS). More particularly, the present invention relates to a VDMOS that incorporates a buried channel.

2. Description of Related Art

FIG. 1 is a cross-sectional view showing a conventional vertical double-diffuision MOS (VDMOS) structure. As shown in FIG. 1, the VDMOS structure is formed by forming an epitaxial layer over a substrate 100. The epitaxial layer is doped with N+ and acts as the drain region 102 of the VDMOS. Next, an N+ doped polysilicon gate 104 is formed over the substrate 100. A channel region 106 is formed above the drain region 102. The channel region 106 and the gate 104 are separated by a gate oxide layer 108. The source region 110 is located between neighboring gates above the channel region 106. The channel region 106 further includes an N doped main region 106a, a first P-doped region 106b, and a second P-doped region 106c. The first P-doped region 106b is located between neighboring gates 104 above the main region 106a, and a portion of the first region 106b extends into a region underneath the gate 104. The second P-doped region 106c borders on the first region 106b below the source region 110 so that the second region 106c is separated from the source region 110 by the first region 106b.

In FIG. 1, a channel is formed in the VDMOS transistor when a high voltage is applied to the gate terminal 104. Therefore, electrons can flow from the source region 110 via the first region 106b and the main region 106a of the channel region 106 towards the drain region 102, thereby forming a conductive circuit. Since the N-type channel of the VDMOS transistor is formed on the surface of the first region 106b, a number of drawbacks related to an NMOS transistor will occur. Examples include the lowering of electron mobility in the channel due to the high electric field created by the gate 104, and the hot carrier effect due to the flow of a high current. These drawbacks result from the channel in the source region 110 formed by free electrons being too close to the substrate 100. When electron mobility is low, not only does the operating time of the device increase, but a larger current is also difficult to produce.

In light of the foregoing, there is a need to improve the vertical double diffusion MOS structure.

SUMMARY OF THE INVENTION

Accordingly, the present invention is to provide a vertical double-diffusion MOS (VDMOS) transistor that also incorporates a buried channel structure. Besides being capable of increasing electron mobility inside the channel, the buried channel is able to lower the capacitor effect between the gate and the substrate of the transistor and reduce the hot carrier effect, and hence increases the speed and the reliability of the device.

To achieve these and other advantages and in accordance with the purpose of the invention, as embodied and broadly described herein, the invention provides a buried channel vertical double-diffusion MOS device. The MOS device comprises a substrate, a drain region, a gate region, a source region and a channel region. The drain region is located above the substrate and the gate region is above the substrate surface. The source region is located between two neighboring gates in the substrate. The channel region is located above the drain region separated from the gate by a gate-insulating layer. The channel region further includes a main region, a buried channel region, a first region and a second region. The buried channel region is located below the gate-insulating layer. The buried channel region is impurity-doped so that the threshold voltage of the buried channel VDMOS device can be adjusted. The first region is located between two neighboring gates in the substrate lying next to the drain region with portion of it extending into a region underneath the gate. The second region is located below the source region next to the first region, but the second region does not have direct contact with the source region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
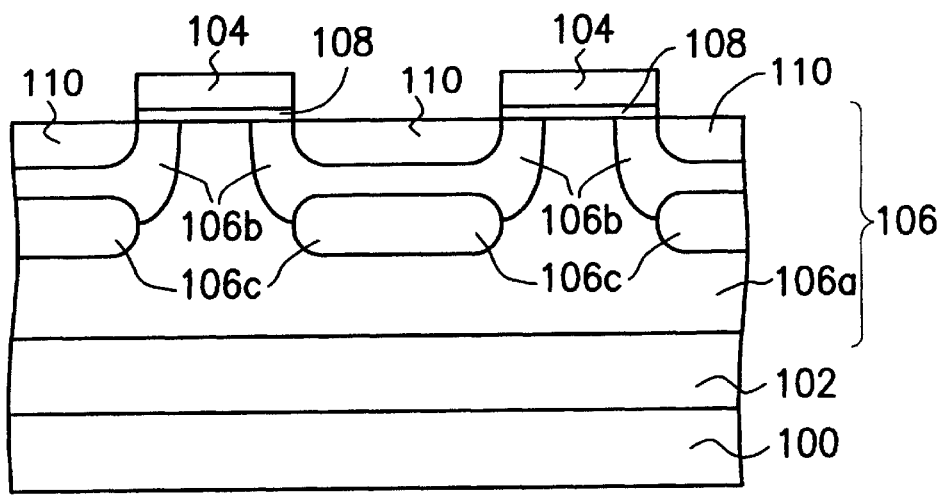
FIG. 1 is a cross-sectional view showing a conventional vertical double-diffusion MOS (VDMOS) structure.

Reference will now be made in detail to the present preferred embodiments of the invention, examples of which are illustrated in the accompanying drawings. Wherever possible, the same reference numbers are used in the drawings and the description to refer to the same or like parts.

A MOS transistor is an electronic device fabricated by depositing silicon dioxide and doped polysilicon over a substrate. The main components of a MOS transistor, beside a MOS capacitor, further include source/drain regions on each side of the MOS capacitor. The source/drain regions have electrical polarity opposite to the substrate region. According to the different channel properties between the source/drain regions, MOS can be further classified into either an NMOS or PMOS.

Figure 2:
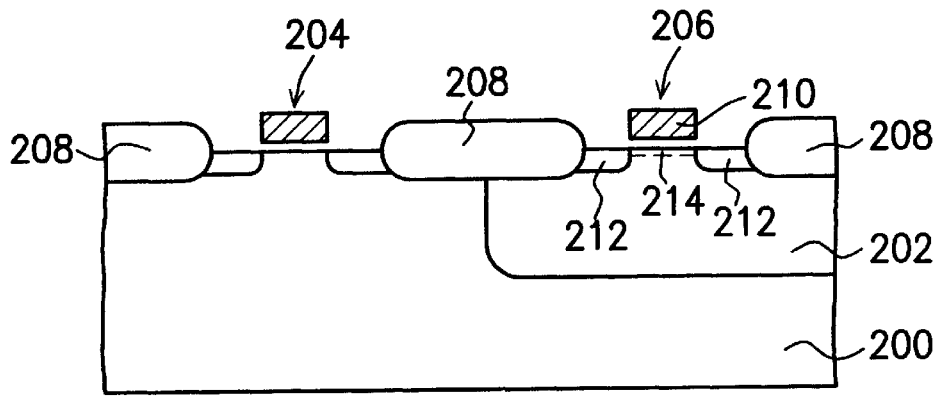
FIG. 2 is a cross-sectional view of a CMOS structure.

A complementary MOS or CMOS is a device that combines a PMOS and an NMOS together and thus is able to complement each other functionally. FIG. 2 is a cross-sectional view of a CMOS structure. As shown in FIG. 2, the CMOS has a P-type substrate 200. Through diffusion of impurities or ion implantation, an N-type semiconductor region 202 known as an N-well is formed in the substrate 200. Subsequently, an NMOS transistor 204 is formed in the P-type substrate and a PMOS transistor 206 is formed in the N-well 202 with a field oxide layer 208 separating the two.

In FIG. 2, the NMOS 204 is a surface channel MOS (SC MOS), while the PMOS 206 has a P-doped region underneath the gate 210 in the substrate between the P-type source/drain regions 212. Therefore, when a voltage is applied to the gate terminal 210, a buried channel is formed. The P-type impurities in the P-doped region are used for adjusting the threshold voltage of the MOS transistor.

Figure 3:
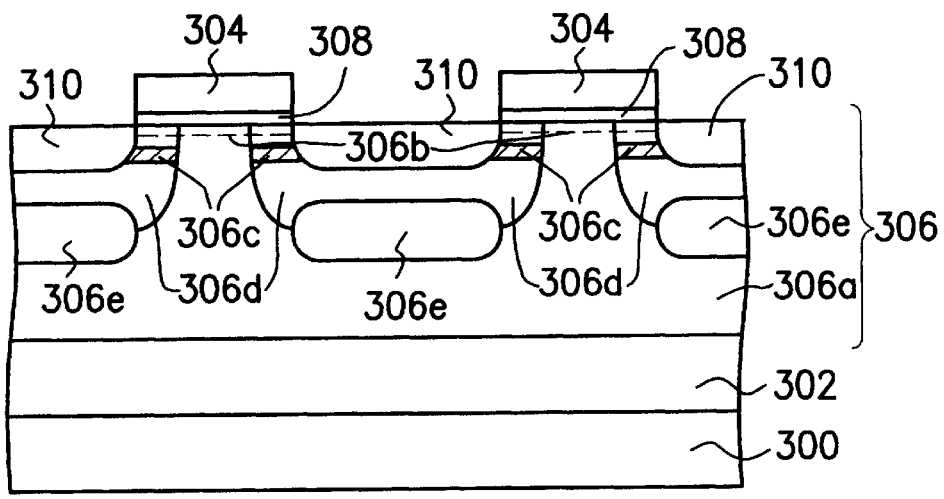
FIG. 3 is a cross-sectional view showing the buried channel vertical double diffusion MOS transistor fabricated according to the preferred embodiment of this invention.

In this invention, a PMOS buried channel similar to the one described above is used in fabricating a vertical double diffusion MOS transistor. FIG. 3 is a cross-sectional view showing the buried channel vertical double-diffusion MOS (VDMOS) transistor fabricated according to the preferred embodiment of this invention. In FIG. 3, an N+ doped epitaxial silicon layer is formed over a substrate 300. The epitaxial layer acts as a drain region 302 for the vertical double-diffusion MOS transistor. There is a P-doped polysilicon gate 304 over the surface of the substrate 300, and there is a channel region 306 above the drain region 302. The channel region 306 is isolated from the gate terminal 304 by a gate-insulating layer 308. There is also an N+ doped source region 310 in the channel region 306 between two neighboring gate terminals 304.

The channel region 306 further includes: an N-doped main region 306a; a buried channel region 306c; an N-doped region 306b located underneath the gate 304 and in the channel region 306 under the gate-insulating layer 308; a first P-doped region 306d under and enclosing the source region 310 with a portion of it extending into the region underneath the gate region 304; and a second P+ doped region 306e located in the channel region underneath the source region 310, in contact with the first region 306d but not in direct contact with the source region 310.

Furthermore, the drain region 302 and the source region 310 have a greater impurity concentration than the buried channel region 306c and the main region 306a, and the gate region 304 and the second region 306e have a greater impurity concentration than the first region 306d.

The purpose of having a P+ doped gate 304 and N-doped channel region 306d in the aforementioned VDMOS transistor is for establishing the buried channel region 306c. The N-type impurities doped into the region 306d serve to adjust the threshold voltage of the gate 304. By applying a high voltage to the gate terminal 304, free electrons in the source region 320 are able to penetrate the buried channel 306c by passing through the main region 306a into the drain region 302 to form a conductive circuit.

Since the buried channel region 306c is further away from the surface of the channel region 306, the effect of an electric field on free electrons in the channel caused by the gate 304 will have lesser effect. Hence, the mobility of free electrons is increased. Furthermore, what separates the buried channel region 306c and the gate 304, beside the gate-insulating layer 308, further includes N-doped layer 306b. Therefore, the capacitance between the gate 304 and the substrate 300 is smaller, and hence the capacitor effect between the two is greatly reduced. Consequently, mobility of free electrons can be increased considerably. Due to the increase in electron mobility, a higher current is able to flow through the device. Therefore, the buried channel VDMOS structure of this invention is able to generate a large current by the input of a small voltage. This capability makes it suitable for controlling a high power circuit, and hence can function as a power transistor. In addition, due to the formation of the buried channel 306c, the hot carrier effect is minimized and so reliability of a device can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A buried channel vertical double-diffusion MOS device wherein electron mobility inside the channel is increased and capacitor effect between a gate and a substrate of a transistor is decreased, comprising:

a substrate;

a drain region located above the substrate and doped by the first dopants to form a region having a first conductivity;

a gate region located above the substrate surface and doped by second dopants to form a region having a second conductivity different than the first conductivity;

a source region located in the substrate between two neighboring gate regions and doped by third dopants to form a region having the first conductivity; and a channel region located above the drain region and isolated from the gate region by a gate-insulating layer, the channel region further including;

a main region doped by fourth dopants to form a region having the first conductivity;

a doping region having a first conductivity under the P-type gate, wherein the doping region is capable of increasing the electron mobility inside the channel and lowering the capacitor effect between the gate and the substrate;

a buried channel region located underneath the doping region and the gate insulating layer in the gate region and doped by fifth dopants to form a region having the first conductivity, wherein the fifth dopants in the buried channel are for adjusting the threshold voltage of the buried channel vertical double-diffusion MOS device;

a first region doped by sixth dopants to form a region having the second conductivity and located in the substrate between two neighboring gate regions next to the source region with a portion extending to a region underneath the gate; and a second region doped by seventh dopants to form a region having the second conductivity and located beneath the source region next to the first region, but not in direct contact with the source region.

2. The device of claim 1, wherein the first dopants for establishing the first conductivity include N-type dopants.

3. The device of claim 1, wherein the gate region includes a polysilicon layer.

4. The device of claim 1, wherein the second dopants for establishing the second conductivity include P-type dopants.

5. The device of claim 1, wherein the third dopants for establishing the first conductivity include N-type dopants.

6. The device of claim 1, wherein the fourth dopants for establishing the first conductivity include N-type dopants.

7. The device of claim 1, wherein the fifth dopants for establishing the second conductivity include N-type dopants.

8. The device of claim 1, wherein the sixth dopants for establishing the second conductivity include P-type dopants.

9. The device of claim 1, wherein the seventh dopants for establishing the second conductivity include P-type dopants.

10. The device of claim 1, wherein the first dopants in the drain region have a higher concentration than the concentration of fourth dopants in the main region and the concentration of fifth dopants in the buried channel.

11. The device of claim 1, wherein the third dopants in the source region have a higher concentration than the concentration of fourth dopants in the main region and the concentration of fifth dopants in the buried channel.

12. The device of claim 1, wherein the second dopants in the gate region have a higher concentration than the concentration of sixth dopants in the first region.

13. The device of claim 1, wherein the seventh dopants in the second region have a higher concentration than the concentration of sixth dopants in the first region.

* * * * *